United States Patent [19]
Seno

[11] Patent Number: 5,848,015
[45] Date of Patent: Dec. 8, 1998

[54] BITLINE PRECHARGE HALT ACCESS MODE FOR LOW POWER OPERATION OF A MEMORY DEVICE

[75] Inventor: Katsunori Seno, Berkeley, Calif.

[73] Assignees: Sony Corporation, Tokyo, Japan; Sony Electronics, Inc., Park Ridge, N.J.

[21] Appl. No.: 693,997

[22] Filed: Aug. 8, 1996

[51] Int. Cl.$^6$ .................................................. G11C 7/00
[52] U.S. Cl. ........................................ 365/203; 365/233
[58] Field of Search ..................................... 365/203, 233

[56] References Cited

U.S. PATENT DOCUMENTS

| | | | |
|---|---|---|---|
| 5,280,449 | 1/1994 | Oldham | 365/189.02 |
| 5,404,325 | 4/1995 | Shibata | 365/149 |
| 5,473,576 | 12/1995 | Matsui | 365/230.06 |
| 5,631,872 | 5/1997 | Naritake et al. | 365/227 |
| 5,699,309 | 12/1997 | Cronin, III et al. | 365/203 |

OTHER PUBLICATIONS

T. Shiraishi, K.Kawamoto, K. Ishikawa, H. Sato, F. Asai, E. Teroka, T. Kengaku, H. Takata, T. Tokuda, K. Nishida, and K. Saitoh, A 1.8 V 36mW DSP for the Half–Rate Speech CODEC, *IEEE* Custom Integrated Circuit Conf. 1996, pp. 371–374.

A. Chandrakasan, A. Burstein and R. Brodersen, A Low Power Chipset For A Portable Multimedia I/O Terminal, *IEEE* Journal of Solid State Circuits, vol. 29, No. 12, Dec. 1994, pp. 1415–1428.

*Primary Examiner*—David C. Nelms
*Assistant Examiner*—Hoai V. Ho
*Attorney, Agent, or Firm*—Haverstock & Owens LLP

[57] ABSTRACT

A precharge halt access mode system reduces the power consumed during sequential accesses of the memory cells within a memory block. During sequential accesses to the memory cells within a row of the memory block in a synchronous system, the bitlines within the memory are only precharged after the memory access to the last memory cell within the row is complete. After accesses to the other memory cells within the row, the precharging operation of the bitlines within the memory block is halted by a halt precharge logic circuit. Once the memory access to the last column within the memory block is detected the precharging of the bitlines is performed. During sequential accesses to the memory cells within a row in an asynchronous system, the bitlines within the memory block are only precharged during an access to the first memory cell within a row. A wordline disabling circuit will disable a wordline signal after an access to the first memory cell is complete. Each column includes a column gate which controls the accesses to each column and the activated memory cell. During a read operation, when a column gate is closed, the data on the bitlines of that column is coupled to inputs of a sense amplifier circuit. The sense amplifier circuit detects the sense of the data and generates an appropriate output. After each memory access operation to the memory block, the inputs to the sense amplifier are precharged. If a precharge halt access mode control signal is disabled the bitlines within a memory block are precharged after each memory access to the memory block.

22 Claims, 8 Drawing Sheets

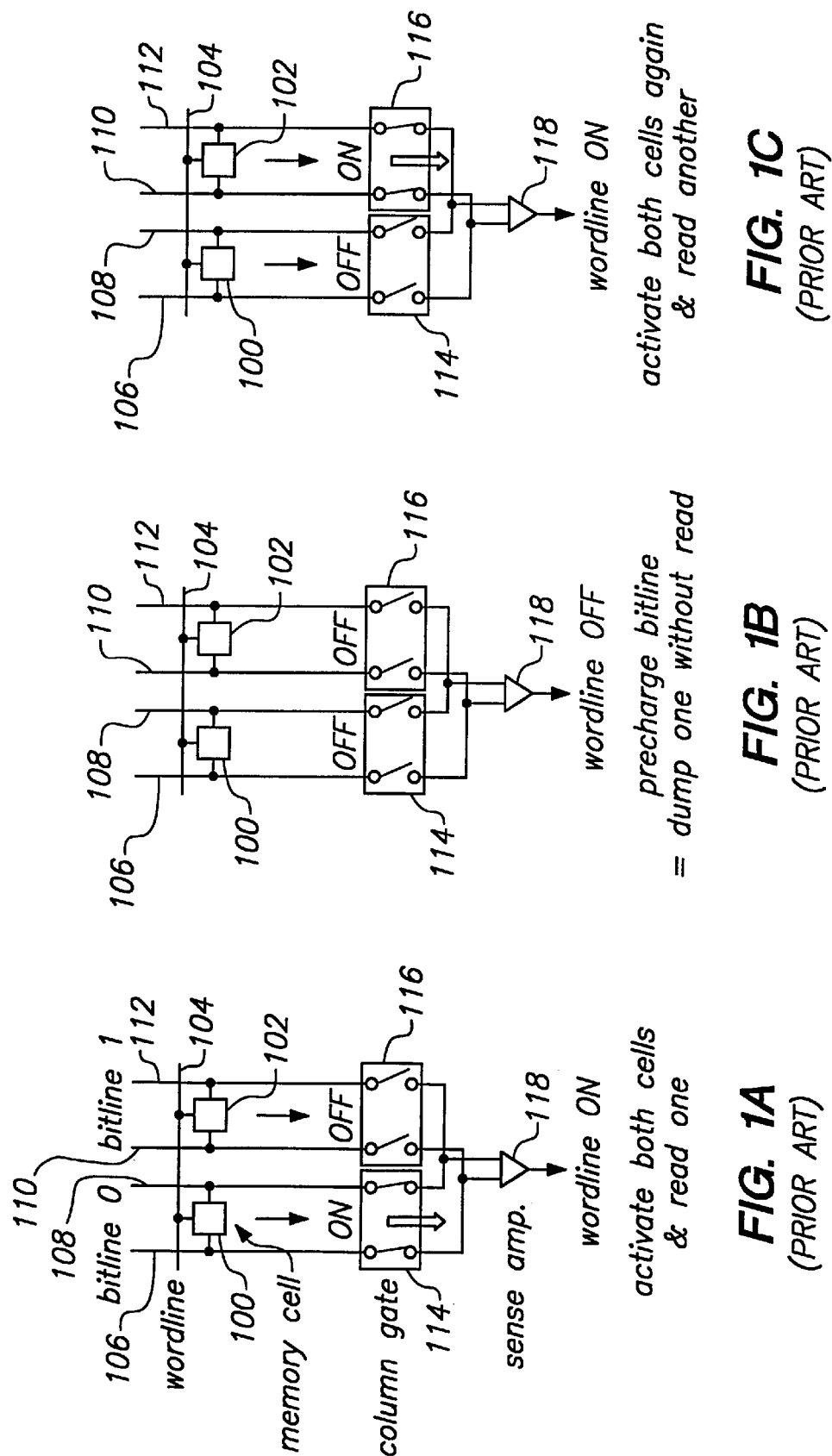

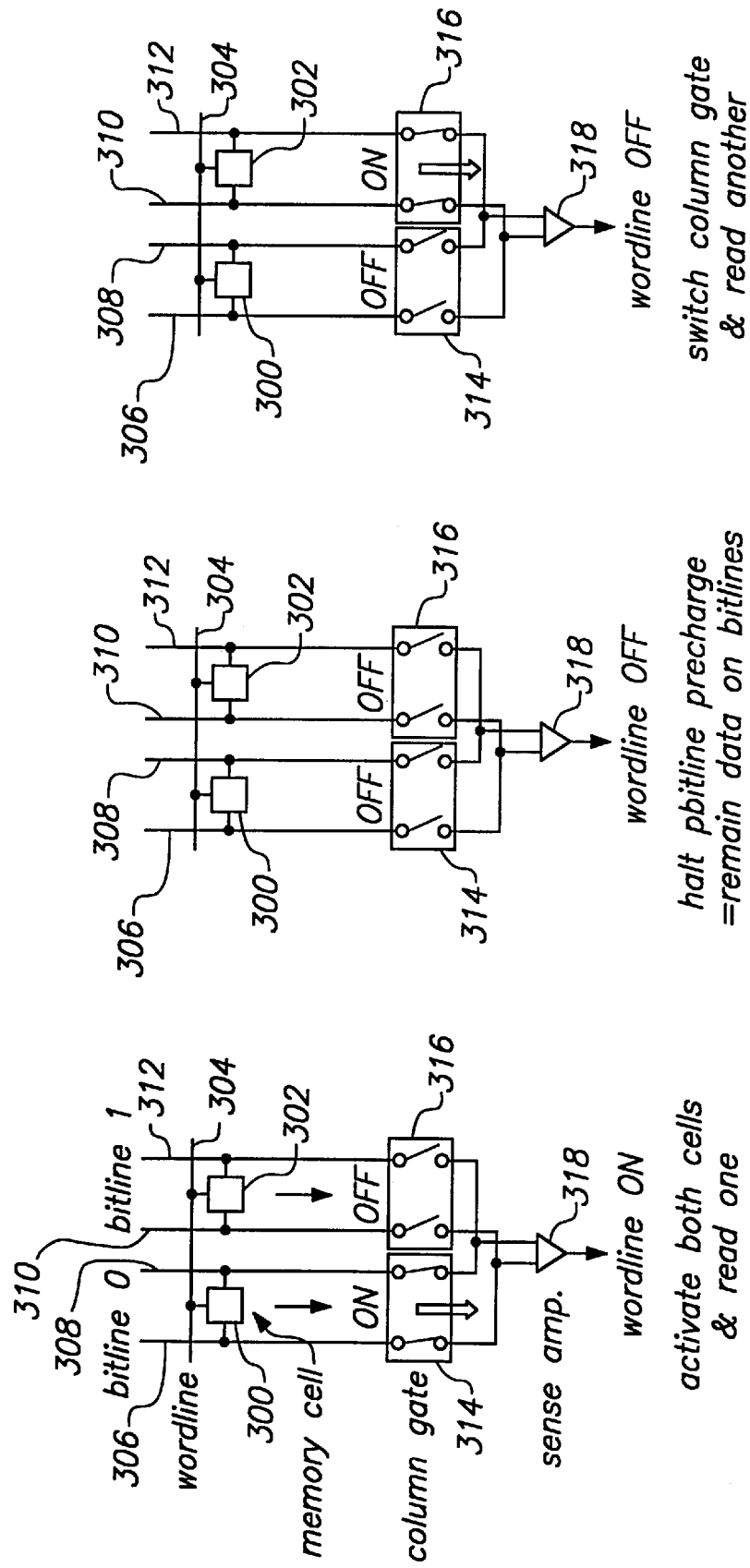

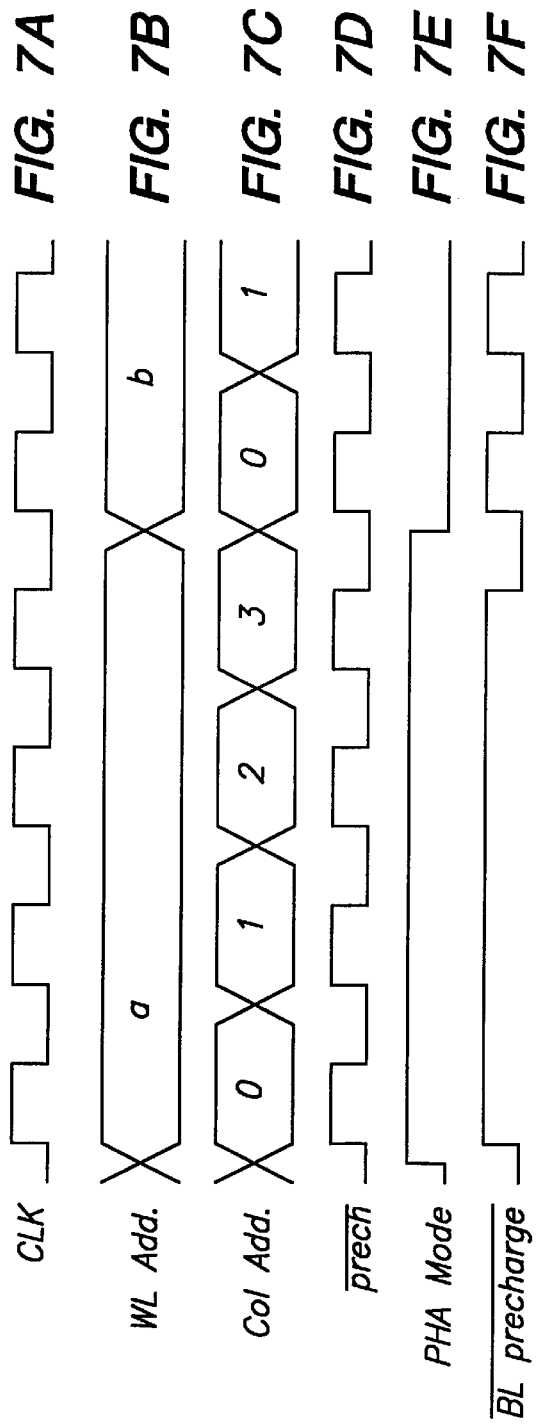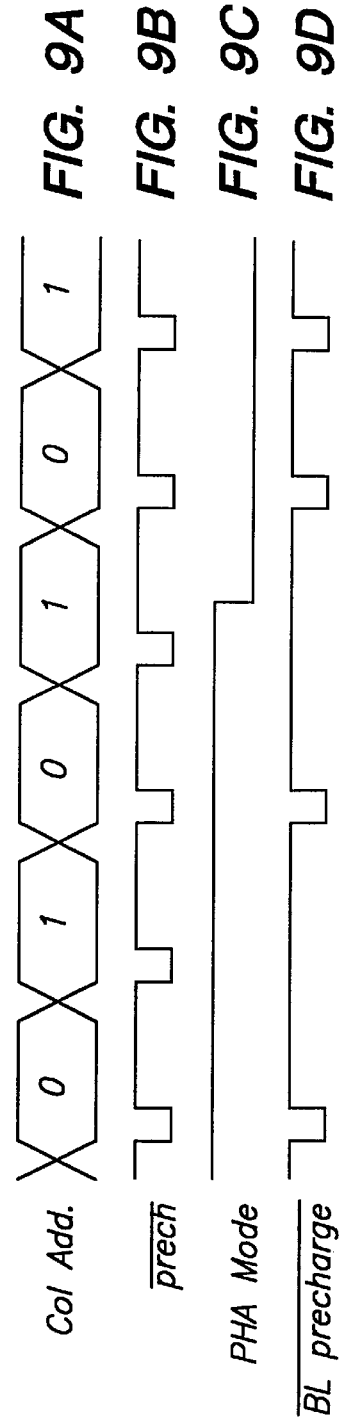

BITLINE PRECHARGE HALT ACCESS MODE FOR LOW POWER OPERATION OF A MEMORY DEVICE

FIELD OF THE INVENTION

The present invention relates to the field of low power operation of a memory device. More particularly, the present invention relates to the field of low power operation of a memory device during sequential access of the memory.

BACKGROUND OF THE INVENTION

Lower power consumption is desirable for all electronic systems, but especially for portable computers which are supplied power from a battery with a finite lifetime. Lower power consumption in line powered systems is also desirable because it will reduce the heat dissipated by the system and thereby increase the reliability of the system. As a result, it is a common goal to design circuits that consume less power. Examples of systems where low power consumption is being actively sought include portable computers such as laptop or palmtop computers, personal digital assistants (PDAs), and wireless communications devices such as cellular telephones and pagers.

Random access memory (RAM) is a component used within such systems to store data for use by the other components of the system. Dynamic RAM (DRAM) is a type of RAM which uses a capacitor-type storage and requires periodic refreshing in order to keep the data valid stored within the DRAM. Static RAM (SRAM) is another type of RAM which retains the information stored within the SRAM as long as power is applied and therefore does not require periodic refreshing.

RAM is generally organized within the system into addressable blocks, each containing a predetermined number of memory cells. Each memory cell within a RAM represents a bit of information. The memory cells are organized into rows and columns. Each row of memory cells forms a word. Each memory cell within a row is coupled to the same wordline which is used to activate the memory cells within the row. The memory cells within each column of a block of memory are coupled to a pair of bitlines which are used to read data from the activated memory cell or write data to the activated memory cell. The pair of bitlines includes a bitline and an inverse bitline. A memory cell is therefore accessed by activating the appropriate wordline and pair of bitlines.

Generally, before a memory access operation is performed to or from a memory cell within a block of memory, the pairs of bitlines within that block of memory are all precharged to a specified voltage level. A memory access operation includes both write and read operations. The precharge operation equalizes the voltage level of the bitlines at a known level, to enhance reliability of the data written to a cell and to allow quick detection of data read from a cell. Because the same pair of bitlines is used for all memory cells within a column, if they were not precharged or equalized before each memory operation, then a second access to a memory cell within the column would require that the bitlines are first equalized from their previous voltage level to a known voltage level and then brought to the appropriate logical voltage level. Accordingly, in order to speed up the performance of the memory, the bitlines within a block of memory are typically all precharged to the specified known voltage level after each memory operation, in anticipation of the next memory operation. This allows the bitlines to be reliably brought to the appropriate logical voltage level faster during the memory operation.

An example of the events which take place during memory operations within a conventional SRAM is illustrated in FIG. 1. A two-cell memory block is illustrated in FIG. 1. The memory cell 100 is coupled to the wordline 104 and to the first pair of bitlines, including the bitline 106 and the inverse bitline 108. The memory cell 102 is coupled to the wordline 104 and to the second pair of bitlines, including the bitline 110 and the inverse bitline 112. The first pair of bitlines 106 and 108 are coupled to input terminals of the column gate circuit 114. The second pair of bitlines 110 and 112 are coupled to input terminals of the column gate circuit 116. An output terminal of the column gate circuit 114, representing the data on the bitline 106, is coupled to an output terminal of the column gate circuit 116, representing the data on the bitline 110, and as an input to a sense amplifier circuit 118. An inverse output terminal of the column gate circuit 114, representing the data on the bitline 108, is coupled to an inverse output terminal of the column gate circuit 116, representing the data on the bitline 112, and as an input to the sense amplifier circuit 118. An output of the sense amplifier circuit 118 provides the output data signal, when data is read from either of the memory cells 100 or 102.

In Figures 1A–1C an example of a read operation performed on each of the memory cells 100 and 102, sequentially, is illustrated. As is well known, during a read operation, either the bitline or the inverse bitline will be discharged from their precharged level to a logical low voltage level, depending on the state of the data stored within the memory cell. The sense amplifier circuit 118 detects which one of the bitline or the inverse bitline is discharged and will then output a logical voltage level corresponding to the sense of the data stored within the memory cell. In FIG. 1A, a read operation is performed on the memory cell 100. The wordline 104 is raised to a logical high voltage level, thereby activating both of the memory cells 100 and 102. The bitlines 106 and 110 and the inverse bitlines 108 and 112 have both been precharged after the last memory operation. When the column gate 114 is closed, the sense amplifier circuit 118 will detect the voltage levels of the bitlines 106 or 108, due to the sense of the data stored within the memory cell 100 and generate an appropriate output signal representing the data stored within the memory cell. During this time, the memory cell 102 is also activated by the wordline 104 and the voltage level of the bitline 110 and the inverse bitline 112 are raised and lowered to correspond to the data stored within the memory cell 102. However, because the system is reading from the memory cell 100, the column gate 116 is kept open, thereby allowing the sense amplifier circuit 118 to detect the sense of the data on the bitlines 106 and 108.

After the sense amplifier circuit 118 has determined the sense of the data stored in the memory cell 100, the wordline 104 is deactivated and all of the bitlines 106, 108, 110 and 112 are precharged, as illustrated in FIG. 1B. During the next memory operation, illustrated in FIG. 1C, a memory operation is performed on the memory cell 102. The wordline 104 is again raised to a logical high voltage level, thereby activating the memory cells 100 and 102. When the column gate 116 is closed, the sense amplifier circuit 118 will then detect the voltage levels of the bitlines 110 or 112, due to the sense of the data stored within the memory cell 100 and generate an appropriate output signal representing the data stored within the memory cell. The memory cell 100 was also activated by the word line and the voltage levels of the bitline 106 and the inverse bitline 108 are raised and lowered to correspond to the data stored within the memory cell 100.

However, because the system is reading from the memory cell 102, the column gate 114 is kept open, allowing the sense amplifier circuit 118 to detect the sense of the data on the bitlines 110 and 112.

Sequential access of memory cells within a block of data, as illustrated in FIG. 1, is very common in many applications. Performing these sequential accesses in the conventional manner, as illustrated in FIG. 1, consumes a lot of power because the wordline is activated during each memory operation and all of the bitlines within the memory block are precharged between each memory operation. While a read operation is illustrated in FIG. 1, it should be understood that the system will operate in a similar manner during write operations.

One prior art method which has been used to reduce the power consumption of a block of memory during sequential accesses to that memory is illustrated in FIG. 2. The memory cell 200 is coupled to the wordline 204 and to the first pair of bitlines, including the bitline 206 and the inverse bitline 208. The memory cell 202 is coupled to the wordline 204 and to the second pair of bitlines, including the bitline 210 and the inverse bitline 212. The first pair of bitlines 206 and 208 are coupled to input terminals of the column gate circuit 214. The second pair of bitlines 210 and 212 are coupled to input terminals of the column gate circuit 216. The output terminals of the column gate circuit 214 are coupled as inputs to a sense amplifier and latch circuit 218. The output terminals of the column gate circuit 216 are coupled as inputs to a sense amplifier and latch circuit 220. An output of the sense amplifier and latch circuit 218 and an output of the sense amplifier and latch circuit 220 are both coupled as inputs to a multiplexer 222. An output of the multiplexer 222 provides the output data signal, when data is read from either of the memory cells 200 or 202.

In FIGS. 2A–2C an example of a read operation performed on each of the memory cells 200 and 202, sequentially, is illustrated. When the wordline 204 is first activated, both of the column gates 214 and 216 are closed and the sense amplifier and latch circuits 218 and 220 both detect the sense of the data stored within the memory cells 200 and 202, respectively. This data is then latched at the output of the sense amplifier and latch circuits 218 and 220. The data is then read, one memory cell, at a time, by controlling the output of the multiplexer 222.

In FIG. 2A, the wordline 204 is raised to a logical high voltage level and the column gates 214 and 216 are both closed. The bitlines 206, 208, 210 and 212 were previously precharged. When the column gate 214 is closed, the sense amplifier and latch circuit 218 will detect the logical voltage levels of the bitlines 206 or 208, due to the sense of the data stored within the memory cell 200. The data detected by the sense amplifier and latch circuit 218 is then latched at the output of the sense amplifier and latch circuit 218. When the column gate 216 is closed, the sense amplifier and latch circuit 220 will detect the logical voltage levels of the bitlines 210 or 212, due to the sense of the data stored within the memory cell 202. The data detected by the sense amplifier and latch circuit 220 is then latched at the output of the sense amplifier and latch circuit 220. The output of the sense amplifier and latch circuit 218, representing the data stored within the memory cell 200, is then passed through the multiplexer 222 and output as the data read from the memory cell 200.

The wordline 204 is then deactivated and all of the bitlines 206, 208, 210 and 212 are precharged, as illustrated in FIG. 2B, in order to be ready for the next memory access of a cell within this memory block. This precharging operation does not effect the data at the output of the sense amplifier and latch circuit 220, which was previously read from the memory cell 202, but has not yet been output. During the next memory operation, illustrated in FIG. 2C, an operation is performed to read the data within the memory cell 202. Because the system has detected that this is a sequential access, the wordline 204 is not raised to a logical high voltage level, the memory cells 200 and 202 are not activated and both the column gates 214 and 216 are kept open. The output of the sense amplifier and latch circuit 220, representing the data stored within the memory cell 202 and read previously, is then passed through the multiplexer 222 and output as the data read from the memory cell 202. The bitlines 206, 208, 210 and 212 are not precharged after this operation, because they have previously been precharged, during the step illustrated in FIG. 2B, to be ready for the next memory operation in this memory block.

This scheme reduces the power consumption during a memory access by reading the data from all of the memory cells in that memory block at once, latching that data and then multiplexing the data out, one column at a time, as necessary to complete the read operations. The bitlines are only precharged after the first access to the memory block, when the data is read from the memory cells and latched by the sense amplifier and latch circuits. While this method does reduce the power consumed by the system, it does however add extra overhead to the system. A sense amplifier and latch circuit must be provided for each column within the memory block, rather than a single sense amplifier for the entire memory block, as illustrated in FIG. 1. Further, a multiplexer must also be added to each memory block, to multiplex the data out from the outputs of the sense amplifier and latch circuits.

What is needed is an apparatus and method for sequentially accessing a memory block which reduces the power consumption during accesses to the memory block and does not require extra overhead and additional circuitry to be added to the memory block.

SUMMARY OF THE INVENTION

A precharge halt access mode system reduces the power consumed during sequential accesses of the memory cells within a memory block. During sequential accesses to the memory cells within a row of the memory block in a synchronous system, the bitlines within the memory are only precharged after the memory access to the last memory cell within the row is complete. After accesses to the other memory cells within the row, the precharging operation of the bitlines within the memory block is halted by a halt precharge logic circuit. Once the memory access to the last column within the memory block is detected the precharging of the bitlines is performed. During sequential accesses to the memory cells within a row in an asynchronous system, the bitlines within the memory block are only precharged during an access to the first memory cell within a row. A wordline disabling circuit will disable a wordline signal after an access to the first memory cell is complete. Each column includes a column gate which controls the accesses to each column and the activated memory cell. During a read operation, when a column gate is closed, the data on the bitlines of that column is coupled to inputs of a sense amplifier circuit. The sense amplifier circuit detects the sense of the data and generates an appropriate output. After each memory access operation to the memory block, the inputs to the sense amplifier are precharged. If a precharge halt access mode control signal is disabled the bitlines within a memory block are precharged after each memory access to the memory block.

BRIEF DESCRIPTION OF THE DRAWINGS

Figures 1A–1C illustrate an example of read operations performed sequentially on two memory cells.

FIGS. 3A–3C illustrate an example of read operations performed sequentially on two memory cells within a low power system according to the present invention.

FIGS. 7A–7F illustrate timing diagrams of signals within the circuit of FIG. 6.

FIGS. 9A–9D illustrate timing diagrams of signals within the asynchronous circuit of FIG. 8.

DETAILED DESCRIPTION OF THE PREFERRED EMBODIMENT

Figures 2A, 2B, 2C:
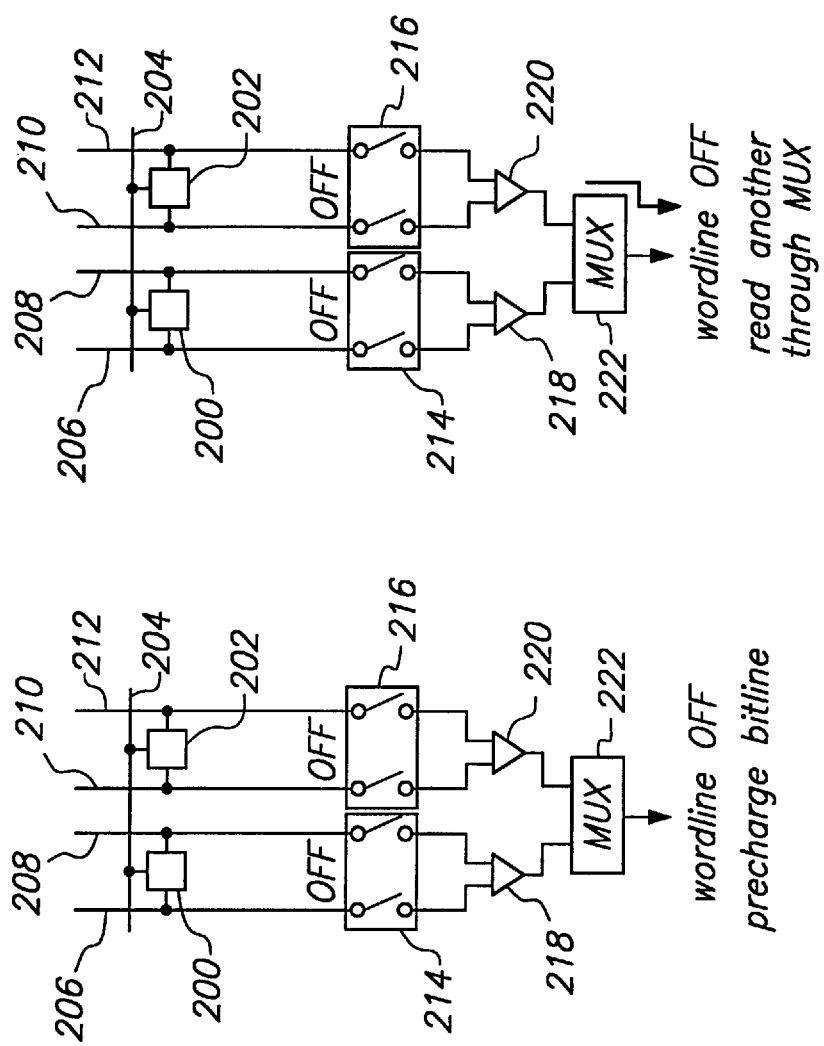
FIGS. 2A–2C illustrate an example of read operations performed sequentially on two memory cells within a low power system of the prior art.

The apparatus and method of the present invention does not perform precharge operations on the bitlines within a memory block between operations during sequential memory accesses to memory cells within a row of the memory block. Thus, power is conserved by limiting the precharging operations, without requiring extra overhead such as is required in prior art systems. Rather, the precharge operation is halted during sequential accesses to memory cells within a row of the memory block until the last sequential access within a memory block is complete, thereby maintaining the appropriate data on the bitlines.

An example of the power conservation memory access method of the present invention is illustrated in FIG. 3. Within this system, the memory cell 300 is coupled to the wordline 304 and to the first pair of bitlines, including the bitline 306 and the inverse bitline 308. The memory cell 302 is coupled to the wordline 304 and to the second pair of bitlines, including the bitline 310 and the inverse bitline 312. The first pair of bitlines 306 and 308 are coupled to input terminals of the column gate circuit 314. The second pair of bitlines 310 and 312 are coupled to input terminals of the column gate circuit 316. An output terminal of the column gate circuit 314, representing the data on the bitline 306, is coupled to an output terminal of the column gate circuit 316, representing the data on the bitline 310, and as an input to a sense amplifier circuit 318. An inverse output terminal of the column gate circuit 314, representing the data on the inverse bitline 308, is coupled to an inverse output terminal of the column gate circuit 316, representing the data on the inverse bitline 312, and as an input to the sense amplifier circuit 318. An output of the sense amplifier circuit 318 provides the output data signal, when data is read from either of the memory cells 300 or 302.

In FIGS. 3A–3C an example of a read operation performed according to the present invention, on each of the memory cells 100 and 102, sequentially, is illustrated. As described above, during a read operation, the sense of the data stored within a memory cell is detected by the sense amplifier circuit by determining the voltage levels of the bitline and the inverse bitline. The sense amplifier 318 detects the voltage levels of the connected bitlines and will then output a logical voltage level corresponding to the sense of the data stored within the memory cell coupled to the sense amplifier through the connected bitlines and the closed switching circuit.

In FIG. 3A, a read operation is performed on the memory cell 300. Before this memory access was initiated, the bitlines 306, 308, 310 and 312 were all precharged to a known voltage level. The wordline 304 is raised to a logical high voltage level, thereby activating the memory cells 300 and 302. When the memory cell 300 is activated, the logical voltage level on the bitline 306 and on the inverse bitline 308 changes to represent the data stored within the memory cell 300. If the data stored within the memory cell 300 is a logical high voltage level, then the bitline 306 is raised to a logical high voltage level and the inverse bitline 308 is pulled down to a logical low voltage level. If the data stored within the memory cell 300 is a logical low voltage level, the bitline 306 is pulled down to a logical low voltage level and the inverse bitline 308 is raised to a logical high voltage level. When the memory cell 302 is activated, the logical voltage level on the bitline 310 and on the inverse bitline 312 changes to represent the data stored within the memory cell 302, in a similar manner.

As will be illustrated and explained below, between each memory access to the memory block, the inputs to the sense amplifier circuit 318 are precharged to a known level in anticipation of the next memory operation. Therefore, to read the data stored in the memory cell 300 and represented on the bitline 306 and the inverse bitline 308, the column gate circuit 314 is closed and the data on the bitlines 306 and 308 will appropriately change the voltage level of the inputs of the sense amplifier circuit 318. In response to the voltage levels at its inputs, the sense amplifier circuit 318 will generate an output signal having an appropriate voltage level, representing the data stored within the memory cell 300.

Between memory accesses, the wordline 304 is deactivated and the column gates 314 and 316 are both opened, as illustrated in FIG. 3B. During this time between memory accesses, the inputs to the sense amplifier 318 are precharged to a known level in order to be ready to detect the sense of the data during the next read operation. Normally, during this time, the bitlines 306, 308, 310 and 312 would also be precharged to a known level. However, because the system detects that the next memory access operation is a sequential access to the next cell within the memory block, the precharging operation of the bitlines is disabled. Because the memory cell 302 was previously activated, the logical voltage level of the bitline 310 and the inverse bitline 312 still represent the data stored within the memory cell 302.

The next memory access is a read operation for the data in the memory cell 302, as illustrated in FIG. 3C. The system detects that this read operation is for the next memory cell within the same row of the memory block. Because the memory cell 302 was previously activated and the logical voltage levels of the bitline 310 and the inverse bitline 312 already represent the data stored within the memory cell 302, the wordline 304 is not activated and the memory cell 302 is kept inactive. To complete the read operation, the column gate circuit 316 is closed and the data on the bitlines 310 and 312 will change the voltage level of the inputs of the sense amplifier circuit 318. In response to the voltage levels at the inputs, the sense amplifier circuit 318 will generate an output signal having an appropriate voltage level, representing the data stored within the memory cell 302. After the memory access to the last memory cell within the row of the memory block, the system will then enable the precharge operation of all of the bitlines within the memory block. In this manner, sequential memory accesses are performed within a block of memory without precharging the bitlines between each operation and without added circuitry within the memory block.

Figure 4:
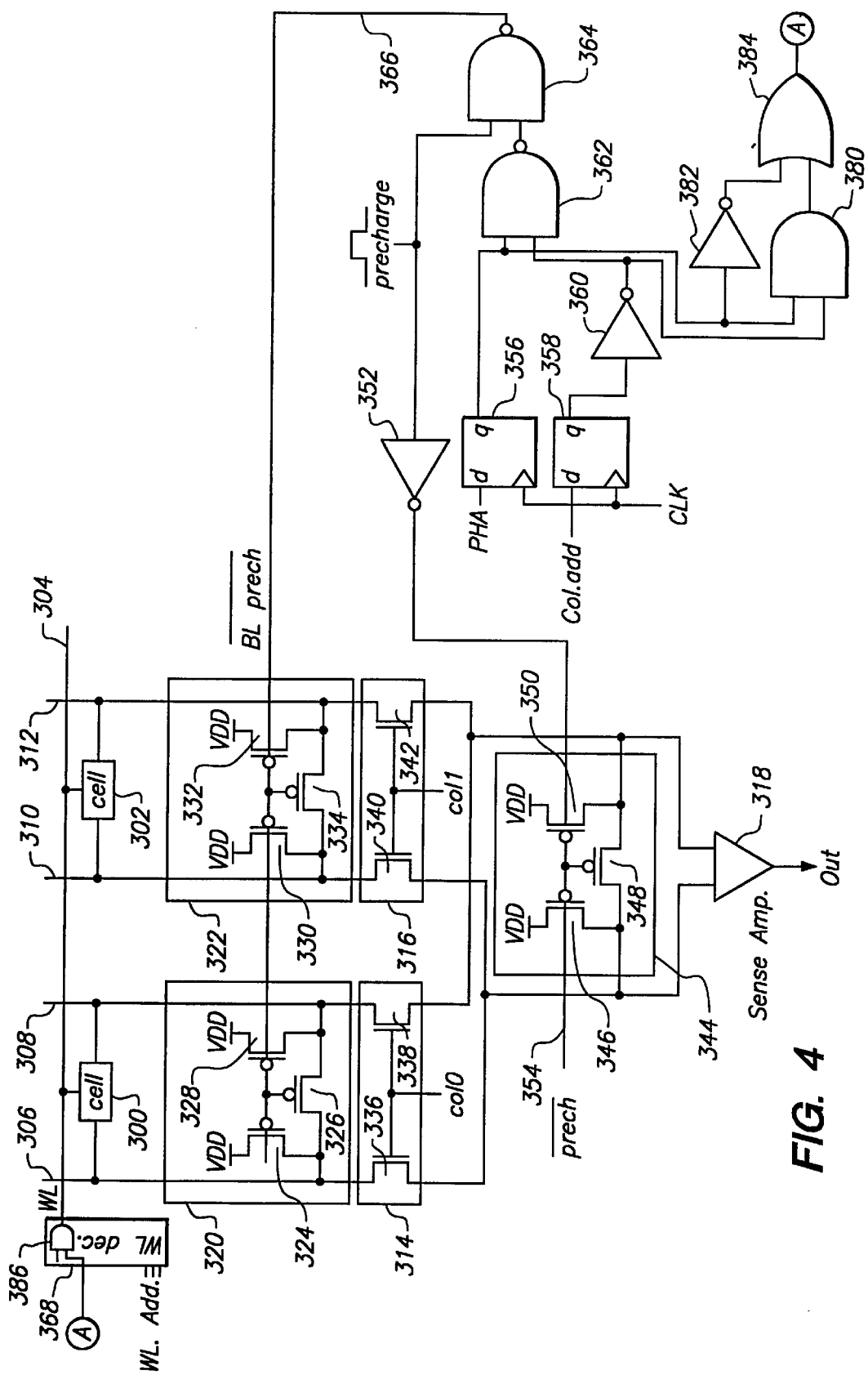
FIG. 4 illustrates a detailed circuit schematic of the low power memory access circuitry of the present invention.

A more detailed circuit schematic of the low power memory access circuitry of the present invention is illustrated in FIG. 4. Within this circuit the wordline address bus WLAdd is coupled to the wordline decoder circuit 368 which activates the wordline for the appropriate row within the memory block based on the value of the wordline address bus. The wordline decoder circuit 368 is coupled to provide the wordline 304 from the output of the logical AND gate 386. The wordline 304 is coupled to the memory cells 300 and 302. The bitline 306 is coupled to the memory cell 300. The inverse bitline 308 is coupled to the memory cell 300. The bitline 310 is coupled to the memory cell 302. The inverse bitline 312 is coupled to the memory cell 302.

The precharging circuit 320 is used to precharge the bitline 306 and the inverse bitline 308. The precharging circuit 320 includes transistors 324, 326 and 328. The inverse bitline precharge signal 366 is coupled to the gates of the transistors 324, 326 and 328. The supply voltage VDD is coupled to the drains of the transistors 324 and 328. The source of the transistor 324 is coupled to the drain of the transistor 326 and to the bitline 306. The source of the transistor 328 is coupled to the source of the transistor 326 and to the inverse bitline 308.

The precharging circuit 322 is used to precharge the bitline 310 and the inverse bitline 312. The precharging circuit 322 includes transistors 330, 332 and 334. The inverse bitline precharge signal 366 is coupled to the gates of the transistors 330, 332 and 334. The supply voltage VDD is coupled to the drains of the transistors 330 and 332. The source of the transistor 330 is coupled to the drain of the transistor 334 and to the bitline 310. The source of the transistor 332 is coupled to the source of the transistor 334 and to the inverse bitline 312.

The column gate circuit 314 is used to couple the data on the bitline 306 and the inverse bitline 308 to the inputs of the sense amplifier circuit 318. The column gate circuit 314 includes the transistors 336 and 338. The drain of the transistor 336 is coupled to the bitline 306. The drain of the transistor 338 is coupled to the inverse bitline 308. The gates of the transistors 336 and 338 are coupled to the column address control signal col0 which is active when a memory access is taking place within the first column of the memory block. The source of the transistor 336 is coupled to an input of the sense amplifier circuit 318. The source of the transistor 338 is also coupled to an input of the sense amplifier circuit 318.

The column gate circuit 316 is used to couple the data on the bitline 310 and the inverse bitline 312 to the inputs of the sense amplifier circuit 318. The column gate circuit 316 includes the transistors 340 and 342. The drain of the transistor 340 is coupled to the bitline 310. The drain of the transistor 342 is coupled to the inverse bitline 312. The gates of the transistors 340 and 342 are coupled to the column address control signal col1 which is active when a memory access is taking place within the last column of the memory block. The source of the transistor 340 is coupled to the source of the transistor 336 and to an input of the sense amplifier circuit 318. The source of the transistor 342 is coupled to the source of the transistor 338 and to an input of the sense amplifier circuit 318.

The precharging circuit 344 is used to precharge the inputs of the sense amplifier circuit 318. The precharging circuit 344 includes the transistors 346, 348 and 350. The inverse precharge signal 354 is coupled to the gates of the transistors 346, 348 and 350, within the precharging circuit 344, and to an output of an inverter circuit 352. The drains of the transistors 346 and 350 are coupled to the supply voltage VDD. The source of the transistor 346 is coupled to the drain of the transistor 348, the source of the transistor 336, the source of the transistor 340 and to an input of the sense amplifier circuit 318. The source of the transistor 350 is coupled to the source of the transistor 348, the source of the transistor 338, the source of the transistor 342 and to an input of the sense amplifier circuit 318.

An input of the inverter 352 is coupled to an input of a logical NAND gate 364. A precharge halt access signal PHA is coupled to a d input of a flip-flop 356. A q output of the flip-flop 356 is coupled to an input of a logical NAND gate 362, to an input of a logical AND gate 380 and to an input of an inverter 382. A column address signal Col.add is coupled to a d input of a flip-flop 358. A q output of the flip-flop 358 is coupled to an input of an inverter 360. A clock signal CLK is coupled to clock inputs of the flip-flops 356 and 358. An output of the inverter 360 is coupled to an input of the logical NAND gate 362 and to an input of the logical AND gate 380. An output of the logical NAND gate 362 is coupled as an input of the logical NAND gate 364. An output of the logical NAND gate 364 provides the inverse bitline precharge signal 366 which is coupled to the gates of the transistors within the precharging circuits 320 and 322. An output of the sense amplifier circuit 318 provides the data output signal Out. An output of the inverter 382 is coupled as an input of the logical OR gate 384. An output of the logical AND gate 380 is coupled as an input of the logical OR gate 384. An output of the logical OR gate 384 is coupled as an input to the logical AND gate 386.

Figure 5:
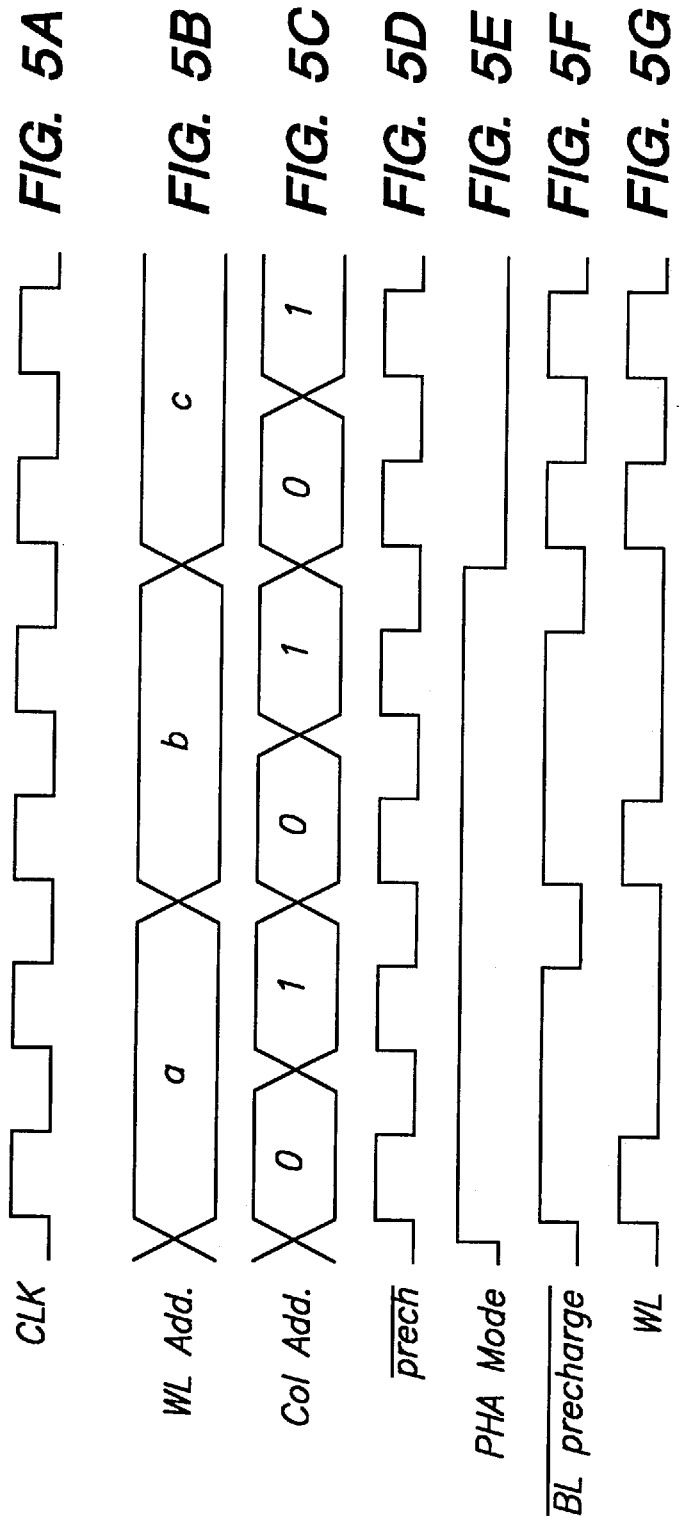
FIGS. 5A–5G illustrate timing diagrams of signals within the circuit of FIG. 4.

Timing diagrams of signals within the circuit of FIG. 4 are illustrated in FIG. 5. A timing diagram of the clock signal CLK is illustrated in FIG. 5A. A timing diagram of the data on the wordline address bus WLAdd is illustrated in FIG. 5B. A timing diagram of the data on the column address bus ColAdd is illustrated in FIG. 5C. A timing diagram of the inverse precharge signal 354 is illustrated in FIG. 5D. A timing diagram of the precharge halt access signal PHA is illustrated in FIG. 5E. A timing diagram of the inverse bitline precharge signal 366 is illustrated in FIG. 5F. A timing diagram of the wordline WL is illustrated in FIG. 5G.

The operation of the circuit of FIG. 4 will be explained in reference to the timing diagrams of FIG. 5. When the system is in the low power mode during sequential accesses of the memory, the precharge halt access signal PHA is at a logical high voltage level. When the precharge halt access signal PHA is at a logical high voltage level, the q output of the flip-flop 356 is also at a logical high voltage level and the output of the logical NAND gate 362 will be equal to the inverse of the output of the inverter 360. Accordingly, when the precharge halt access signal PHA is at a logical high voltage level and the column address is equal to a "0", signalling that the system is accessing the memory cell 300, the q output of the flip-flop 358 will be equal to a logical low voltage level and the output of the logical NAND gate 362 will also be equal to a logical low voltage level. When the output of the logical NAND gate 362 is equal to a logical low voltage level, the output of the logical NAND gate 364 will always be equal to a logical high voltage level, no matter what the level of the other input. Therefore, when the column address is equal to a "0" and the precharge halt access mode signal PHA is at a logical high voltage level, the bitlines 306, 308, 310 and 312 will not be precharged after the access of the memory cell 300 in the first column of the memory block.

When the column address is equal to a "1" and the precharge halt access signal PHA is at a logical high voltage level, the q output of the flip-flop 358 will be equal to a logical high voltage level and the output of the logical NAND gate 362 will also be equal to a logical high voltage level. When the output of the logical NAND gate 362 is at a logical high voltage level, the output of the logical NAND gate 364 will be equal to the inverse precharge signal 354. At the falling edge of the next clock signal when the inverse precharge signal 354 falls to a logical low voltage level, the inverse bitline precharge signal 366, output from the logical NAND gate 364, will also be pulled to a logical low voltage level, thereby precharging the bitlines 306, 308, 310 and 312 through the precharging circuits 320 and 322. When the inverse precharge signal 354 rises to a logical high voltage level at the end of the precharging period, the inverse bitline precharge signal 366 will also rise to a logical high voltage level.

In this manner, the precharging of the bitlines within a memory block is only performed, after a memory access to the last column of the memory block, during a precharge halt access mode. After each sequential memory access, the inputs to the sense amplifier 318 are precharged through the precharging circuit 344, as controlled by the inverse precharge signal 354. When the precharge halt access signal PHA is at a logical low voltage level, signalling that the system is not in the low power mode, the inverse bitline precharge signal 366 follows the inverse precharge signal 354 and precharges the bitlines within the memory block after each memory access operation. Accordingly, the system can switch between the low power mode, in which the bitlines are not precharged after every memory access, and a conventional mode, in which the bitlines are precharged after every memory access, by controlling the logical voltage level of the precharge halt access mode signal PHA.

The logical AND gate 380, the inverter 382, the logical OR gate 384 and the logical AND gate 386, together form a wordline disable circuit which disables activation of the wordline 304 after a memory access operation to the first column within the memory block, when the system is in the low power mode. In the low power mode the wordline 304 is only activated during a memory access to the first column of the memory block. In accesses to subsequent columns in the memory block the wordline 304 is disabled, thus saving power consumed by the system.

When the system is in the low power mode during sequential accesses of the memory, the precharge halt access signal PHA and the q output of the flip-flop 356 are at logical high voltage levels. When the q output of the flip-flop 356 is at a logical high voltage level, the output of the inverter 382 will be at a logical low voltage level and therefore the output of the logical OR gate 384 will be equal to the output of the logical AND gate 380. When the q output of the flip-flop 356 is at a logical high voltage level, the output of the logical AND gate 380 will be equal to the output of the inverter 360. Accordingly, during low power mode operation, when the precharge halt access signal PHA is at a logical high voltage level, the output of the logical OR gate 384 will only be equal to a logical high voltage level during an access to the first column of the memory block, when the q output of the flip-flop 358 is equal to a logical low voltage level and the output of the inverter 360 is equal to a logical high voltage level.

The output of the logical OR gate 384 is coupled to the logical AND gate 386, where it is ANDed with the wordline input itself to generate the wordline signal WL 304, used to activate the memory cells 300 and 302. When the system is in the low power mode, during sequential accesses to the memory, the wordline WL 304 will therefore only be pulled to a logical high voltage level during accesses to the first column of the memory block. The wordline WL 304 will not be activated during accesses to subsequent columns of the memory block.

Figure 6:
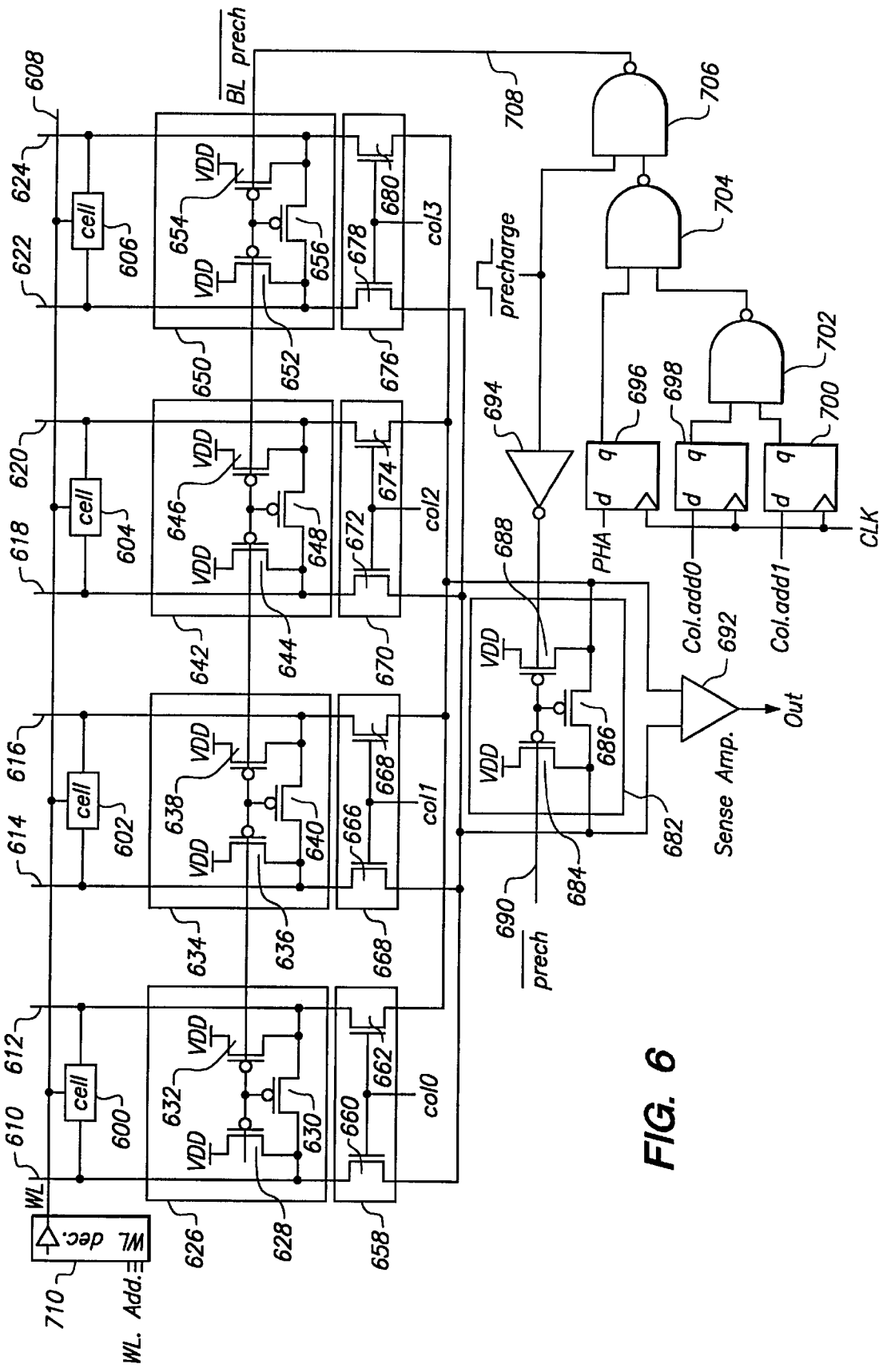
FIG. 6 illustrates a detailed circuit schematic of the low power memory access circuitry of the present invention within a four column memory block.

A detailed circuit schematic of a low power memory access circuit within a four column memory block is illustrated in FIG. 6. The wordline address bus WLAdd is coupled to the wordline decoder circuit 710 which activates the wordline for the appropriate row, based on the value of the wordline address bus. The wordline decoder circuit 710 is coupled to the wordline 608. The wordline 608 is coupled to the memory cells 600, 602, 604 and 606. The bitline 610 and the inverse bitline 612 are coupled to the memory cell 600. The bitline 614 and the inverse bitline 616 are coupled to the memory cell 602. The bitline 618 and the inverse bitline 620 are coupled to the memory cell 604. The bitline 622 and the inverse bitline 624 are coupled to the memory cell 606.

The precharging circuit 626 is used to precharge the bitline 610 and the inverse bitline 612. The precharging circuit 626 includes transistors 628, 630 and 632. The inverse bitline precharge signal 708 is coupled to the gates of the transistors 628, 630 and 632. The supply voltage VDD is coupled to the drains of the transistors 628 and 632. The source of the transistor 630 is coupled to the drain of the transistor 630 and to the bitline 610. The source of the transistor 632 is coupled to the source of the transistor 630 and to the inverse bitline 612.

The precharging circuit 634 is used to precharge the bitline 614 and the inverse bitline 616. The precharging circuit 634 includes transistors 636, 638 and 640. The inverse bitline precharge signal 708 is coupled to the gates of the transistors 636, 638 and 640. The supply voltage VDD is coupled to the drains of the transistors 636 and 638. The source of the transistor 636 is coupled to the drain of the transistor 640 and to the bitline 614. The source of the transistor 638 is coupled to the source of the transistor 640 and to the inverse bitline 616.

The precharging circuit 642 is used to precharge the bitline 618 and the inverse bitline 620. The precharging circuit 642 includes transistors 644, 646 and 648. The inverse bitline precharge signal 708 is coupled to the gates of the transistors 644, 646 and 648. The supply voltage VDD is coupled to the drains of the transistors 644 and 646. The source of the transistor 644 is coupled to the drain of the transistor 648 and to the bitline 618. The source of the transistor 646 is coupled to the source of the transistor 648 and to the inverse bitline 620.

The precharging circuit 650 is used to precharge the bitline 622 and the inverse bitline 624. The precharging circuit 650 includes transistors 652, 654 and 656. The inverse bitline precharge signal 708 is coupled to the gates of the transistors 652, 654 and 656. The supply voltage VDD is coupled to the drains of the transistors 652 and 654. The source of the transistor 652 is coupled to the drain of the transistor 656 and to the bitline 622. The source of the transistor 654 is coupled to the source of the transistor 656 and to the inverse bitline 624.

The column gate circuit 658 is used to couple the data on the bitline 610 and the inverse bitline 612 to the inputs of the sense amplifier circuit 692. The column gate circuit 658 includes the transistors 660 and 662. The drain of the transistor 660 is coupled to the bitline 610. The drain of the transistor 662 is coupled to the inverse bitline 612. The gates of the transistors 660 and 662 are coupled to a column address signal col0. The source of the transistor 660 is coupled to an input of the sense amplifier circuit 692. The source of the transistor 662 is also coupled to an input of the sense amplifier circuit 692.

The column gate circuit 664 is used to couple the data on the bitline 614 and the inverse bitline 616 to the inputs of the sense amplifier circuit 692. The column gate circuit 664 includes the transistors 666 and 668. The drain of the transistor 666 is coupled to the bitline 614. The drain of the transistor 668 is coupled to the inverse bitline 616. The gates of the transistors 666 and 668 are coupled to a column address signal col1. The source of the transistor 666 is coupled to the source of the transistor 660 and to an input of the sense amplifier circuit 692. The source of the transistor 668 is coupled to the source of the transistor 662 and to an input of the sense amplifier circuit 692.

The column gate circuit 670 is used to couple the data on the bitline 618 and the inverse bitline 620 to the inputs of the sense amplifier circuit 692. The column gate circuit 670 includes the transistors 672 and 674. The drain of the transistor 672 is coupled to the bitline 618. The drain of the transistor 674 is coupled to the inverse bitline 620. The gates of the transistors 672 and 674 are coupled to a column address signal col2. The source of the transistor 672 is coupled to the source of the transistor 660, to the source of the transistor 666 and to an input of the sense amplifier circuit 692. The source of the transistor 674 is coupled to the source of the transistor 662, to the source of the transistor 668 and to an input of the sense amplifier circuit 692.

The column gate circuit 676 is used to couple the data on the bitline 622 and the inverse bitline 624 to the inputs of the sense amplifier circuit 692. The column gate circuit 676 includes the transistors 678 and 680. The drain of the transistor 678 is coupled to the bitline 622. The drain of the transistor 680 is coupled to the inverse bitline 624. The gates of the transistors 678 and 680 are coupled to a column address signal col3. The source of the transistor 678 is coupled to the source of the transistor 660, to the source of the transistor 666, to the source of the transistor 672 and to an input of the sense amplifier circuit 692. The source of the transistor 680 is coupled to the source of the transistor 662, to the source of the transistor 668, to the source of the transistor 674 and to an input of the sense amplifier circuit 692.

The precharging circuit 682 is used to precharge the inputs of the sense amplifier circuit 692. The precharging circuit 692 includes the transistors 684, 686 and 688. The inverse precharge signal 690 is coupled to the gates of the transistors 684, 686 and 688, within the precharging circuit 682, and to an output of an inverter circuit 694. The drains of the transistors 684 and 688 are coupled to the supply voltage VDD. The source of the transistor 684 is coupled to the drain of the transistor 686, to the sources of the transistors 660, 666, 672 and 678 and to an input of the sense amplifier circuit 692. The source of the transistor 688 is coupled to the source of the transistor 686, to the sources of the transistors 662, 668, 674 and 680 and to an input of the sense amplifier circuit 692.

An input of the inverter 694 is coupled to an input of a logical NAND gate 706. A precharge halt access signal PHA is coupled to a d input of a flip-flop 696. A q output of the flip-flop 696 is coupled to an input of a logical NAND gate 704. A least significant bit of the column address bus Col.add0 is coupled to a d input of a flip-flop 698. A most significant bit of the column address bus Col.add1 is coupled to a d input of a flip-flop 700. A clock signal CLK is coupled to clock inputs of the flip-flops 696, 698 and 700. The q outputs of the flip-flops 698 and 700 are coupled as inputs to a logical NAND gate 702. An output of the logical NAND gate 702 is coupled to an input of the logical NAND gate 704. An output of the logical NAND gate 704 is coupled to an input of the logical NAND gate 706. An output of the logical NAND gate 706 provides the inverse bitline precharge signal 708. An output of the sense amplifier circuit 692 provides the output data signal Out.

Timing diagrams of signals within the circuit of FIG. 6 are illustrated in FIG. 7. A timing diagram of the clock signal CLK is illustrated in FIG. 7A. A timing diagram of the data on the wordline address bus WLAdd is illustrated in FIG. 7B. A timing diagram of the data on the column address bus ColAdd is illustrated in FIG. 7C. A timing diagram of the inverse precharge signal 690 is illustrated in FIG. 7D. A timing diagram of the precharge halt access signal PHA is illustrated in FIG. 7E. A timing diagram of the inverse bitline precharge signal 708 is illustrated in FIG. 7F.

The operation of the circuit of FIG. 6 will be explained in reference to the timing diagrams of FIG. 7. While the circuit of FIG. 6 does not include a wordline disable circuit, as was illustrated in FIG. 4 and described above, it should be apparent to those skilled in the art that the wordline disable circuit could be included within this embodiment in order to disable activation of the wordline after an access to the first column within the memory block. When the system is in the low power mode during sequential accesses of the memory, the precharge halt access signal PHA is at a logical high voltage level. When the precharge halt access signal PHA is at a logical high voltage level, the q output of the flip-flop 696 is also at a logical high voltage level and the output of the logical NAND gate 704 will be equal to the inverse of the output of the logical NAND gate 702. Therefore, as long as the output of the logical NAND gate 702 is equal to a logical high voltage level, the output of the logical NAND gate 704 is kept at a logical low voltage level, the inverse bitline precharge signal 708 is kept at a logical high voltage level and the bitlines will not be precharged. The output of the logical NAND gate 702 will be equal to a logical high voltage level as long as either of the column address bus bits Coladd0 and Coladd1 are equal to a logical low voltage level.

When both of the column address bus bits Coladd0 and Coladd1 are equal to a logical high voltage level, signalling that the current memory access is taking place at the last column within the current row of the memory block, the output of the logical NAND gate 702 is equal to a logical low voltage level. When the output of the logical NAND gate 702 is equal to a logical low voltage level, the output of the logical NAND gate 704 will be equal to a logical high voltage level. As long as the output of the logical NAND gate 704 is equal to a logical high voltage level, the output of the logical NAND gate 706 will be equal to the value of the inverse precharge signal 690.

When the precharge halt access signal PHA is at a logical high voltage level, the bitlines within the memory block are only precharged after a memory access to the last column within the memory block. As described above, after each sequential memory access, the inputs to the sense amplifier 692 are precharged through the precharging circuit 682, as controlled by the inverse precharge signal 690. When the precharge halt access signal PHA is at a logical low voltage level, the inverse bitline precharge signal 708 follows the inverse precharge signal 690 and precharges the bitlines within the memory block after each memory access operation. Accordingly, the system can switch between the low power mode, in which the bitlines are only precharged after a memory access to the last column within the row, and a conventional mode, in which the bitlines are precharged after every memory access, by controlling the logical voltage level of the precharge halt access mode signal PHA.

Figure 8:
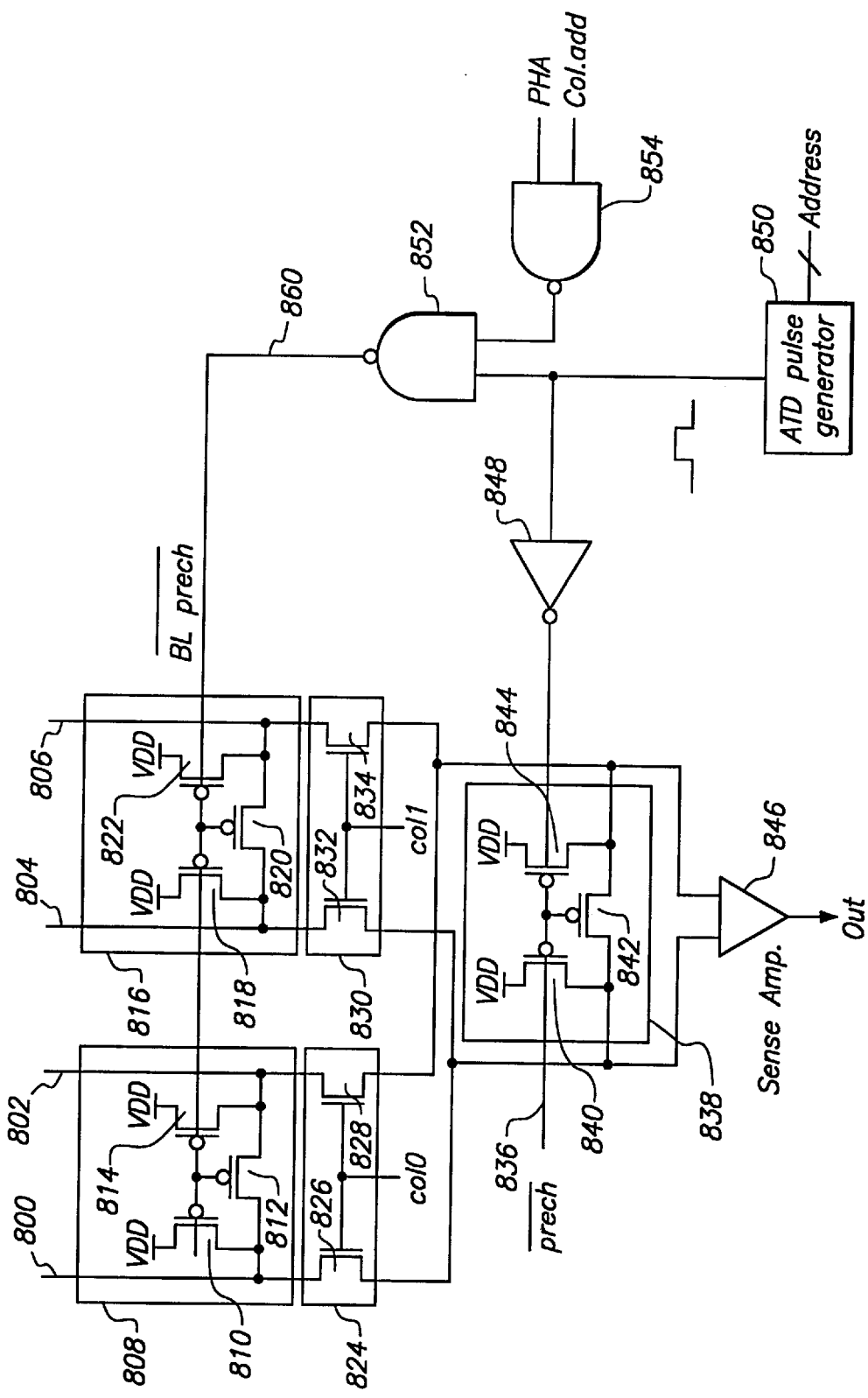
FIG. 8 illustrates a detailed circuit schematic of the low power memory access circuitry of the present invention within an asynchronous memory block.

A block diagram circuit schematic of an asynchronous low power memory access circuit, according to the present invention, within a two column memory block, is illustrated in FIG. 8. Though not illustrated, it should be understood that the bitline 800 and the inverse bitline 802 are coupled to a memory cell. Correspondingly, it should also be understood that the bitline 804 and the inverse bitline 806 are also coupled to a memory cell. The precharging circuit 808 is used to precharge the bitline 800 and the inverse bitline 802. The precharging circuit 808 includes the transistors 810, 812 and 814. The inverse bitline precharge signal 860 is coupled to the gates of the transistors 810, 812 and 814. The supply voltage VDD is coupled to the drains of the transistors 810 and 814. The source of the transistor 810 is coupled to the drain of the transistor 812 and to the bitline 800. The source of the transistor 814 is coupled to the source of the transistor 812 and to the inverse bitline 802.

The precharging circuit 816 is used to precharge the bitline 804 and the inverse bitline 806. The precharging circuit 816 includes transistors 818, 820 and 822. The inverse bitline precharge signal 860 is coupled to the gates of the transistors 818, 820 and 822. The supply voltage VDD is coupled to the drains of the transistors 818 and 822. The source of the transistor 818 is coupled to the drain of the transistor 820 and to the bitline 804. The source of the transistor 822 is coupled to the source of the transistor 820 and to the inverse bitline 806.

The column gate circuit 824 is used to couple the data on the bitline 800 and the inverse bitline 802 to the inputs of the sense amplifier circuit 846. The column gate circuit 824 includes the transistors 826 and 828. The drain of the transistor 826 is coupled to the bitline 800. The drain of the transistor 828 is coupled to the inverse bitline 802. The gates of the transistors 826 and 828 are coupled to the column address control signal col0 which is active when a memory access is taking place within the first column of the memory block. The source of the transistor 826 is coupled to an input of the sense amplifier circuit 846. The source of the transistor 828 is coupled to an input of the sense amplifier circuit 846.

The column gate circuit 830 is used to couple the data on the bitline 804 and the inverse bitline 806 to the inputs of the sense amplifier circuit 846. The column gate circuit 830 includes the transistors 832 and 834. The drain of the transistor 832 is coupled to the bitline 804. The drain of the transistor 834 is coupled to the inverse bitline 806. The gates of the transistors 832 and 834 are coupled to the column address control signal col1 which is active when a memory access is taking place within the last column of the memory block. The source of the transistor 832 is coupled to the source of the transistor 826 and to an input of the sense amplifier circuit 846. The source of the transistor 834 is coupled to the source of the transistor 828 and to an input of the sense amplifier circuit 846.

The precharging circuit 838 is used to precharge the inputs of the sense amplifier circuit 846. The precharging circuit 846 includes transistors 840, 842 and 844. The inverse precharge signal 836 is coupled to the gates of the transistors 840, 842 and 844, within the precharging circuit 838, and to an output of the inverter circuit 848. The drains of the transistors 840 and 844 are coupled to the supply voltage VDD. The source of the transistor 840 is coupled to the drain of the transistor 842, the source of the transistor 826, the source of the transistor 832 and to an input of the sense amplifier circuit 846. The source of the transistor 844 is coupled to the source of the transistor 842, the source of the transistor 828, the source of the transistor 834 and to an input of the sense amplifier circuit 846.

An input of the inverter 848 is coupled to an input of a logical NAND gate 852 and to an output of the address transition detector (ATD) pulse generator circuit 850. An address bus is coupled as an input to the ATD pulse generator circuit 850. A precharge halt access signal PHA is coupled as an input to a logical NAND gate 854. A column address signal Col.add is also coupled as an input to the logical NAND gate 854. An output of the logical NAND gate 854 is coupled as an input to the logical NAND gate 852. An output of the logical NAND gate 852 provides the inverse bitline precharge signal 860 which is coupled to the gates of transistors within the precharging circuits 808 and 816. An output of the sense amplifier circuit 846 provides the data output signal Out.

Timing diagrams of signals within the circuit of FIG. 8 are illustrated in FIG. 9. A timing diagram of the data on the column address bus Col.add is illustrated in FIG. 9A. A timing diagram of the inverse precharge signal 836 is illustrated in FIG. 9B. A timing diagram of the precharge halt access signal PHA is illustrated in FIG. 9C. A timing diagram of the inverse bitline precharge signal 860 is illustrated in FIG. 9D.

The operation of the circuit of FIG. 8 will be explained in reference to the timing diagrams of FIG. 9. While the circuit of FIG. 8 does not include a wordline disable circuit as was illustrated in FIG. 4 and described above, it should be apparent to those skilled in the art that the wordline disable circuit could be included within this asynchronous embodiment in order to disable activation of the wordline after an access to the first column within the memory block.

When the system is in the low power mode during sequential accesses of the memory, the precharge halt access signal PHA is at a logical high voltage level. When the precharge halt access signal PHA is at a logical high voltage level, the output of the logical NAND gate 854 will be equal to the inverse of the value of the column address bus Col.add. The only time that the inverse bitline precharge signal 860 provided from the output of the logical NAND gate 852 will be at a logical low voltage level will be when both of the inputs of the logical NAND gate 852 are at logical high voltage levels. During a low power mode, the output of the logical NAND gate 854 will only be at a logical high voltage level during an access to the first column of the memory block, when the column address bus Col.add is equal to a logical low voltage level. The ATD pulse generator circuit 850 will generate a pulse at a logical high voltage level when it detects an address transition on the address bus. Accordingly, the inverse bitline precharge signal 860 will only be pulled to a logical low voltage level and the bitline precharge circuits 808 and 816 will only be activated when the column address bus Col.add is at a logical low voltage level, during an access operation to the first column of the memory block, and the ATD pulse generator circuit detects an address transition and generates a pulse. During accesses to subsequent columns, within the memory block, the inverse bitline precharge signal 860 is kept at a logical high voltage level and the bitline precharge circuits 808 and 816 are not activated.

In the asynchronous low power memory access circuitry of FIG. 8, when the precharge halt access signal PHA is at a logical high voltage level, the bitlines within the memory block are not precharged after each sequential memory access, but only during a memory access to the first column within the memory block. Also, as described above, after each sequential memory access, the inputs to the sense amplifier circuit 846 are precharged through the precharging circuit 838, as controlled by the inverse precharge signal 836. When the precharge halt access signal PHA is at a logical low voltage level, the inverse bitline precharge signal 860, output from the logical NAND gate 852, will follow the inverse precharge signal 836 and precharge the bitlines within the memory block during each memory access operation.

A low power memory access system according to the present invention reduces the power consumed by a memory block during sequential accesses of the memory cells within the memory block. The bitlines within a row are only precharged after the memory access to the last column within the row is complete, during sequential accesses to the memory. The precharging of the bitlines is halted after accesses to the other memory cells within the row. Once the memory access to the last column within the memory block is complete, the bitlines within the memory block are precharged. The inputs to a sense amplifier within the memory block are precharged after each memory access. A precharge halt access signal PHA is used to switch between the low power mode and a conventional mode. When in the conventional mode, the bitlines within a memory block are precharged after every memory access operation. In the manner described, power is saved during sequential accesses to a memory block by not precharging the bitlines after each memory access operation to the memory block.

While the preferred embodiment of the present invention has been illustrated and described as an integrated circuit using MOS transistors, it will be apparent to a person of ordinary skill in the art that the circuit of the present invention may be implemented using another device technology, including but not limited to BJT, discrete components and ECL. It will also be apparent to those skilled in the art that different logic circuit configurations could be substituted for the logic circuits described above to perform the functions of the preferred embodiment. Furthermore, while that present invention has been described and illustrated during sequential read accesses to the memory block, it should be apparent to those skilled in the art after reading this disclosure, that the operation of the present invention will be similar during sequential write accesses to the memory block. Also, while the present invention has been described and illustrated in memory blocks of two and four columns, it will be apparent to those skilled in the art that the present invention can be implemented in memory blocks having other numbers of columns.

The present invention has been described in terms of specific embodiments incorporating details to facilitate the understanding of principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

I claim:

1. A method of accessing memory cells within a row of a memory block, the row having multiple columns, comprising the steps of:
   a. activating a precharge halt access signal during sequential accesses of the memory cells within the row;
   b. disabling a bitline precharge operation between memory access operations of the memory cells within the row if the precharge halt access signal is activated; and
   c. precharging bitlines within the memory block only after a memory access operation of a last memory cell within the row is complete.

2. The method as claimed in claim 1 further comprising the step of detecting if a current memory access operation is being performed on the last memory cell within the row.

3. The method as claimed in claim 2 further comprising the step of precharging inputs to a sense amplifier circuit after each memory access operation, wherein the sense amplifier circuit detects a state of bitlines for a column in which a current memory access operation is being performed.

4. The method as claimed in claim 3 further comprising the step of detecting addresses of memory access operations and determining if the operations are sequential.

5. The method as claimed in claim 1 wherein the step of disabling includes detecting if the current memory access operation is being performed on the last memory cell within the row.

6. The method as claimed in claim 5 wherein the step of disabling is performed if the current memory access operation is not being performed on the last memory cell within the row.

7. The method as claimed in claim 1 wherein the method of accessing is used for both write and read memory access operations.

8. The method as claimed in claim 1 further comprising the step of enabling a wordline signal only during a memory access operation of a first memory cell within the row.

9. An apparatus for accessing memory cells within a row of a memory block, the row having multiple columns and the block having multiple rows, comprising:
   a. means for activating a precharge halt access signal during sequential accesses of the memory cells within the row;
   b. means for disabling a bitline precharge operation within the memory block between memory access operations of the memory cells within the row if the precharge halt access signal has been activated by the means for activating; and
   c. means for precharging bitlines within the memory block only after a memory access operation of a last memory cell within the row.

10. The apparatus as claimed in claim 9 further comprising means for detecting if a current memory access operation is being performed on the last memory cell within the row.

11. The apparatus as claimed in claim 10 further comprising means for detecting a logic state of bitlines of a column within the memory block to which the current memory access operation is being performed.

12. The apparatus as claimed in claim 11 wherein the means for disabling disables the bitline precharge operation only if the current memory access operation is not being performed on the last memory cell within the row.

13. The apparatus as claimed in claim 9 further comprising means for enabling a wordline signal only during a memory access operation of a first memory cell within the row.

14. An apparatus for accessing memory cells within a row of a memory block, the row having multiple columns and the block having multiple rows, comprising:
   a. means for activating a precharge halt access signal during sequential accesses of the memory cells within the row;
   b. means for disabling a bitline precharge operation within the memory block between memory access operations of the memory cells within the row if the precharge halt access signal has been activated by the means for activating;
   c. means for precharging bitlines within the memory block only during a memory access operation of a predetermined memory cell within the row; and
   d. means for determining a state of bitlines corresponding to a currently accessed memory cell, wherein the means for determining includes a plurality of inputs which are precharged after each memory access operation.

15. The apparatus as claimed in claim 14 further comprising means for enabling a wordline signal only during a memory access operation of a first memory cell within the row.

16. The apparatus as claimed in claim 14 wherein the apparatus is asynchronous and the means for precharging bitlines only precharges the bitlines during a memory access operation of a first memory cell within the row.

17. The apparatus as claimed in claim 14 wherein the apparatus is synchronous and the means for precharging bitlines only precharges the bitlines after a memory access operation of a last memory cell within the row.

18. An apparatus for accessing memory cells within a row of a memory block, the row having multiple columns and the block having multiple rows, comprising:
   a. means for activating a precharge halt access signal during sequential accesses of the memory cells within the row;
   b. means for disabling a wordline signal, used to activate the memory cells, after a memory access of a first memory cell is complete, if the precharge halt access signal has been activated by the means for activating;
   c. means for determining a state of bitlines corresponding to a currently accessed memory cell, wherein the means for determining includes a plurality of inputs; and
   d. means for precharging coupled to the means for determining for precharging the plurality of inputs after each memory access operation.

19. The apparatus as claimed in claim 18 further comprising means for detecting if a current memory access operation is being performed on the first memory cell within the row.

20. The apparatus as claimed in claim 19 further comprising means for detecting a logic state of bitlines of a column within the memory block to which the current memory access operation is being performed.

21. An apparatus for accessing memory cells within a row of a memory block, the row having multiple columns and the block having multiple rows, comprising:
   a. a control logic circuit for activating a precharge halt access signal during sequential accesses of the memory cells within the row;
   b. a detecting logic circuit for detecting if a current memory access operation is being performed on a last memory cell within the row;
   c. a precharging circuit coupled to the control logic circuit and to the detecting logic circuit for precharging the bitlines within the memory block only after a memory access operation of the last memory cell within the row, if the precharge halt access signal has been activated by the control logic circuit and after each memory operation if the precharge halt access signal has not been activated by the control logic circuits;
   d. a sense amplifier coupled to the bitlines within the memory block to detect a state of bitlines for a column in which a current memory access operation is being performed,. wherein the sense amplifier includes a plurality of inputs which are precharged after each memory access operation.

22. The apparatus as claimed in claim 9 further comprising a sense amplifier circuit coupled to the bitlines within the memory block to detect a state of bitlines for a column in which a current memory access operation is being performed, wherein the sense amplifier circuit includes a plurality of inputs which are precharged after each memory access operation.

\* \* \* \* \*